United States Patent
Kim

(10) Patent No.: US 9,559,079 B2
(45) Date of Patent: Jan. 31, 2017

(54) SEMICONDUCTOR STACK PACKAGES

(71) Applicant: SK hynix Inc., Icheon-si Gyeonggi-do (KR)

(72) Inventor: Moon Soo Kim, Yongin-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/638,741

(22) Filed: Mar. 4, 2015

(65) Prior Publication Data

US 2016/0099203 A1    Apr. 7, 2016

(30) Foreign Application Priority Data

Oct. 1, 2014 (KR) .................... 10-2014-0132434

(51) Int. Cl.
*H01L 23/498* (2006.01)
*H01L 25/065* (2006.01)

(52) U.S. Cl.
CPC . *H01L 25/0652* (2013.01); *H01L 2224/05553* (2013.01); *H01L 2224/05554* (2013.01); *H01L 2224/32145* (2013.01); *H01L 2224/48091* (2013.01); *H01L 2224/48145* (2013.01); *H01L 2224/48227* (2013.01); *H01L 2224/49175* (2013.01); *H01L 2224/73265* (2013.01); *H01L 2225/0651* (2013.01); *H01L 2225/06506* (2013.01); *H01L 2225/06562* (2013.01); *H01L 2225/06575* (2013.01); *H01L 2924/15184* (2013.01); *H01L 2924/181* (2013.01)

(58) Field of Classification Search
CPC .................................................. H01L 25/0652
See application file for complete search history.

(56) References Cited

U.S. PATENT DOCUMENTS

| | | | |
|---|---|---|---|
| 2004/0238924 A1 | 12/2004 | Song | |
| 2005/0204223 A1* | 9/2005 | Ong | G01R 31/2884 714/724 |
| 2008/0001304 A1 | 1/2008 | Kim et al. | |
| 2012/0286398 A1 | 11/2012 | Lee | |
| 2014/0138851 A1* | 5/2014 | Kim | H01L 25/0652 257/777 |

* cited by examiner

*Primary Examiner* — Long Pham
(74) *Attorney, Agent, or Firm* — William Park & Associates Ltd.

(57) ABSTRACT

A semiconductor stack package includes a printed circuit board (PCB), a first semiconductor chip, and a second semiconductor chip. The first and second semiconductor chips are disposed side-by-side on a first surface of the PCB to be spaced apart from each other. Each of the first and second semiconductor chips includes a command/address (CA) chip pad and a data input/output (DQ) chip pad. The CA chip pad of the first semiconductor chip is electrically coupled to the CA chip pad of the second semiconductor chip through a CA bonding wire.

14 Claims, 7 Drawing Sheets

SEMICONDUCTOR STACK PACKAGES

CROSS-REFERENCE TO RELATED APPLICATION

The present application claims priority under 35 U.S.C 119(a) to Korean Application No. 10-2014-0132434, filed on Oct. 1, 2014, in the Korean intellectual property Office, which is incorporated herein by reference in its entirety as set forth in full.

BACKGROUND

1. Technical Field

Embodiments of the disclosure relate to semiconductor stack packages, and more particularly, to semiconductor stack packages including a plurality chips disposed side-by-side on a single plane.

2. Related Art

In the electronics industry, multi-functional or highly integrated semiconductor packages with compact sizes are increasingly in demand with the development of smaller and higher performance electronic systems. In response to such a demand, various package technologies for arraying or disposing many semiconductor chips in a single semiconductor package have been proposed to provide the multi-functional and highly integrated semiconductor packages. These multi-chip packages may be readily realized by designing at least one semiconductor chip in each package to be a multi-functional chip or by increasing a capacity of the at least one semiconductor chip in each package. Thus, the multi-chip packages may have the advantage of relatively short development period and low fabrication cost.

Since each of the multi-chip packages is fabricated by stacking semiconductor chips, the multi-chip packages may also be referred to as stack packages. The stack packages may be typically categorized as either vertical stack packages or horizontal stack packages according to a method of stacking the semiconductor chips. Each of the vertical stack packages may be realized by vertically stacking semiconductor chips on a package substrate, and each of the horizontal stack packages may be realized by arraying or disposing semiconductor chips side-by-side on a package substrate.

SUMMARY

According to an embodiment, a semiconductor stack package includes a printed circuit board (PCB) having a first surface opposing a second surface. The semiconductor stack package may also include a command/address (CA) bonding pad, a first data input/output (DQ) bonding pad, and a second DQ bonding pad are disposed on the first surface of the PCB. The semiconductor stack package may also include a first semiconductor chip disposed on the first surface between the CA bonding pad and the first DQ bonding pad, including a first CA chip pad and a first DQ chip pad. A second semiconductor chip is disposed on the first surface between the first DQ bonding pad and the second DQ bonding pad including a second CA chip pad and a second DQ chip pad. A CA external connection terminal and a DQ external connection terminal are disposed on the second surface of the PCB. The first CA chip pad is electrically to the second CA chip pad through a first bonding wire. The CA external connection terminal is electrically coupled to the first CA chip pad through the CA bonding pad. The DQ external connection terminal is electrically coupled to the first DQ chip pad through the first DQ bonding pad and is electrically coupled to the second DQ chip pad through the second DQ bonding pad.

According to an embodiment, a semiconductor stack package includes a printed circuit board (PCB), a first semiconductor chip, and a second semiconductor chip. The first semiconductor chip and a second semiconductor chip are disposed side-by-side on a first surface of the PCB to be spaced apart from each other, each including a command/address (CA) chip pad and a data input/output (DQ) chip pad. The CA chip pad of the first semiconductor chip is electrically coupled to the CA chip pad of the second semiconductor chip through a CA bonding wire.

According to an embodiment, a semiconductor stack package includes a printed circuit board (PCB) having a first surface opposite to a second surface. A command/address (CA) bonding pad, a first data input/output (DQ) bonding pad, and a second DQ bonding pad are disposed on the first surface of the PCB. First semiconductor chips are stacked on the first surface between the CA bonding pad and the first DQ bonding pad each including a first CA chip pad and a first DQ chip pad. Second semiconductor chips are stacked on the first surface between the first DQ bonding pad and the second DQ bonding pad, each including a second CA chip pad and a second DQ chip pad. A CA external connection terminal and a DQ external connection terminal are disposed on the second surface of the PCB. The first semiconductor chips are stacked to provide a stepped structure so that the first CA chip pads are exposed. The second semiconductor chips are stacked to provide a stepped structure so that the second CA chip pads are exposed. The first CA chip pads are electrically coupled to the second CA chip pads through CA bonding wires. The CA external connection terminal is electrically coupled to the first CA chip pads through the CA bonding pad. The DQ external connection terminal is electrically coupled to the first DQ chip pads through the first DQ bonding pad and is electrically coupled to the second DQ chip pads through the second DQ bonding pad.

DETAILED DESCRIPTION

It will be understood that although the terms first, second, third etc. may be used to describe various elements, these elements should not be limited by these terms, for example, specific sequences. These terms are only used to distinguish one element from another element. It will also be understood that when an element is referred to as being "on," "above," "below," or "under" another element, it can be directly "on," "above," "below," or "under" the other element, respectively, or intervening elements may also be present. Accordingly, the terms such as "on," "above," "below," or "under" which are used are for the purpose of describing particular embodiments only and are not intended to limit the inventive concept. It will be further understood that when an element is referred to as being "connected" or "electrically coupled" to another element, it can be directly connected or electrically coupled to the other element or intervening elements may be present. Further, various embodiments of the invention are directed to semiconductor stack packages, each of which includes a plurality chips arrayed or disposed side-by-side on a single plane.

The Joint Electron Device Engineering Council (JEDEC) is an independent semiconductor engineering trade organization and standardization body that represents all areas of the electronics industry, associated with the electronic industries alliance (EIA) in the United States.

According to the standard documents (e.g., JESD209A-1 and JESD209-2B) of the JEDEC relating to solid state memories, rules about arrays of external terminals of semiconductor packages including memory devices are defined. Each of the external terminals may have a specific function to write data into predetermined regions of each memory device or to read out the data stored in predetermined regions of each memory device. The external terminals may include command/address (CA) external terminals and data input/output (DQ) external terminals. CA signals applied to the CA external terminals may control read/write operations of a semiconductor memory device (also, referred to as a semiconductor memory chip). CA signals may also generate addresses of memory cells in the semiconductor memory chip during the read/write operations. The DQ external terminals may receive external data or may output data stored in the semiconductor memory chip. The CA external terminals may be disposed in a CA external terminal region and the DQ external terminals may be disposed in a DQ external terminal region which is separated from or adjacent to the CA external terminal region. More specifically, the CA external terminals are not disposed between the DQ external terminals. In addition, the DQ external terminals are not disposed between the CA external terminals.

Figure 1:
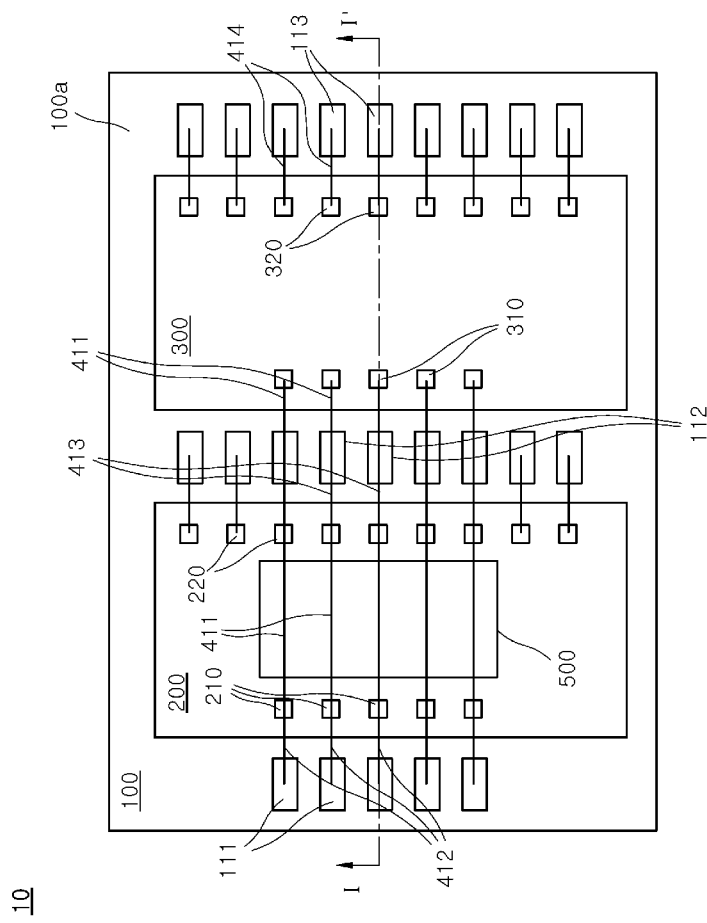
FIG. 1 is a top plan view illustrating a semiconductor stack package according to an embodiment.
Figure 2:
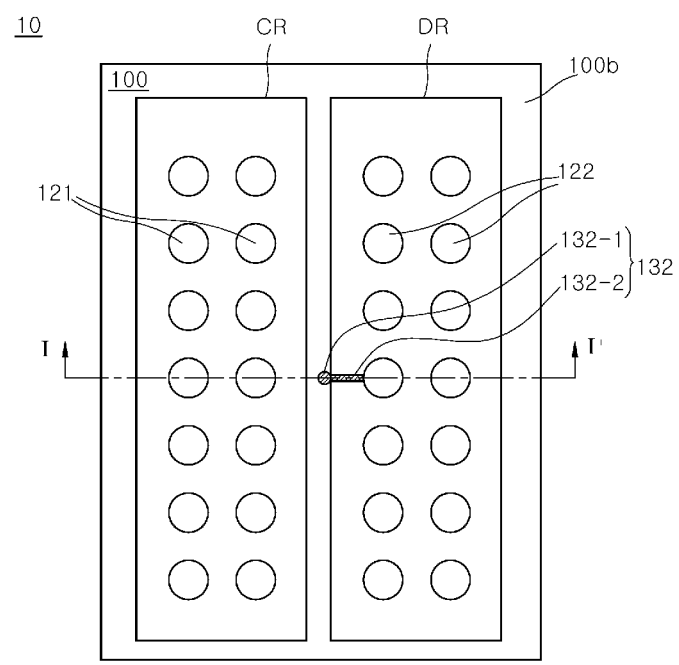
FIG. 2 is a bottom plan view illustrating a semiconductor stack package according to an embodiment.
Figure 3:
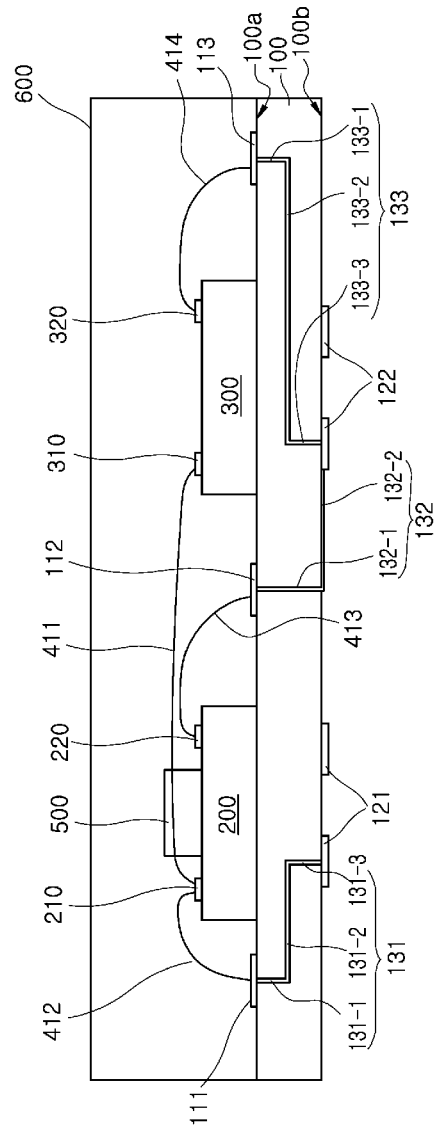
FIG. 3 is a cross-sectional view illustrating the semiconductor stack package shown in FIGS. 1 and 2.

Referring to FIGS. 1, 2 and 3, a semiconductor stack package 10 according to an embodiment is illustrated. FIG. 1 is a top plan view illustrating the semiconductor stack package 10 according to an embodiment. Further, FIG. 2 is a bottom plan view illustrating the semiconductor stack package 10 shown in FIG. 1. In addition, FIG. 3 is a cross-sectional view taken along a line I-I' of FIGS. 1 and 2.

The semiconductor stack package 10 may include a printed circuit board (PCB) 100 having a first surface 100a that is opposite to a second surface 100b, a first semiconductor chip 200 disposed on the first surface 100a, and a second semiconductor chip 300 disposed on the first surface 100a. The first and second semiconductor chips 200 and 300 may be mounted on the PCB 100 side-by-side. The first and second semiconductor chips 200 and 300 may be spaced apart from each other as well. The PCB 100 may include a CA bonding pad 111, a first DQ bonding pad 112, and a second DQ bonding pad 113 disposed on the first surface 100a thereof. The PCB 100 may further include a CA external connection terminals 121 and a DQ external connection terminals 122 disposed on the second surface 100b thereof opposite to the first and second semiconductor chips 200 and 300. The first semiconductor chip 200 may be disposed between the CA bonding pad 111 and the first DQ bonding pad 112. In addition, the first semiconductor chip 200 may include a first CA chip pad 210 and a first DQ chip pad 220. The second semiconductor chip 300 may be disposed between the first DQ bonding pad 112 and the second DQ bonding pad 113. Further, the second semiconductor chip 300 may include a second CA chip pad 310 and a second DQ chip pad 320. In general, a CA bonding pad disposed on a PCB may be arrayed to respectively correspond to a CA chip pad of a semiconductor chip mounted on the PCB. Moreover, a DQ bonding pad disposed on a PCB may be arrayed to respectively correspond to a DQ chip pad of a semiconductor chip mounted on the PCB. If a multiple number of semiconductor chips having the same function are disposed in a single package, all of the same functional chip pads of the multiple number of semiconductor chips may be electrically coupled in common to any one of bonding pads.

The first CA chip pad 210 may be disposed on the first semiconductor chip 200 to be adjacent to the CA bonding pad 111. Further, the first DQ chip pad 220 may be disposed to be opposite to the first CA chip pad 210. The first CA chip pad 210 may be arrayed in a line along an edge of the first semiconductor chip 200 which is closest to the CA bonding pad 111. The first CA chip pad 210 may be electrically coupled to the second CA chip pad 310 on the second semiconductor chip 300 through a first bonding wire 411, respectively. In addition, the first CA chip pad 210 may be electrically coupled to the CA bonding pad 111 through a second bonding wire 412, respectively. The first DQ chip pad 220 may be electrically coupled to the first DQ bonding pad 112 through a third bonding wire 413, respectively. The first CA chip pad 210 may be disposed on an edge of the first semiconductor chip 200 adjacent to the CA bonding pad 111. In addition, the first DQ chip pad 220 may be disposed on another edge of the first semiconductor chip 200 adjacent to the first DQ bonding pad 112.

The second CA chip pad 310 may be disposed on the second semiconductor chip 300 to be adjacent to the first DQ bonding pad 112. Further, the second DQ chip pad 320 may be disposed to be opposite to the second CA chip pad 310. The second CA chip pad 310 may be arrayed in a line along an edge of the second semiconductor chip 300 which is closest to the first DQ bonding pad 112. The second CA chip pad 310 may be electrically coupled to the first CA chip pad 210 through the first bonding wire 411 as described above. The second DQ chip pad 320 may be electrically coupled to the second DQ bonding pad 113 through a fourth bonding wire 414, respectively. The second CA chip pad 310 may be disposed on an edge of the second semiconductor chip 300 adjacent to the first DQ bonding pad 112. In addition, the second DQ chip pad 320 may be disposed on another edge of the second semiconductor chip 300 adjacent to the second DQ bonding pad 113.

The CA bonding pad 111 of the PCB 100 may be arrayed in a line. In addition, the first DQ bonding pad 112 of the PCB 100 may also be arrayed in a line. Similarly, the second DQ bonding pad 113 of the PCB 100 may be arrayed in a line. The CA bonding pad 111 may be arrayed in a line along the first CA chip pad 210. In addition, the first DQ bonding pad 112 may be arrayed in a line along the first DQ chip pad 220. Moreover, the second DQ bonding pad 113 may be arrayed in a line along the second DQ chip pad 320.

Although not shown in the drawings, the PCB 100 may further include an additional bonding pad disposed on the first surface 100a to have different functions from the CA bonding pad 111, the first DQ bonding pad 112, and the second DQ bonding pad 113. The additional bonding pad may include a power bonding pad, a ground bonding pad, a ZQ bonding pad, or a clock bonding pad. In such a case, an additional chip pad corresponding to the additional bonding pad may be disposed on each of the first and second semiconductor chips 200 and 300.

Referring once more to FIG. 2, a CA external connection terminal 121 and a DQ external connection terminal 122 may be disposed on the second surface 100b of the PCB 100 opposite to the first and second semiconductor chips 200 and 300 respectively. A CA external terminal region CR is defined on the second surface 100b. The CA external connection terminals 121 may be disposed in the CA external terminal region CR to be spaced apart from each other by a predetermined distance. The first semiconductor chip 200 of FIG. 1 may be disposed on the first surface 100a of the PCB 100 to vertically overlap with a portion of the CA external terminal region CR. The CA external connection terminal 121 may be arrayed along at least one row and/or at least one column. The CA external connection terminal 121 may be electrically coupled to the CA bonding pad (111 of FIG. 1) through a first internal interconnection line (131 of FIG. 3), respectively. A DQ external terminal region DQ is defined on the second surface 100b. The DQ external connection terminal 122 may be disposed in the DQ external terminal region DR to be spaced apart from each other by a predetermined distance. The second semiconductor chip 300 of FIG. 1 may be disposed on the first surface 100a of the PCB 100 to vertically overlap with a portion of the DQ external terminal region DR. The DQ external connection terminal 122 may be arrayed along at least one row and/or at least one column. The DQ external connection terminal 122 may also be electrically coupled to the first DQ bonding pad (112 of FIG. 1) through a second internal interconnection line 132, respectively. The DQ external connection terminal 122 may be electrically coupled to the second DQ bonding pad (113 of FIG. 1) through a third internal interconnection line (133 of FIG. 3), respectively.

In FIGS. 1, 2 and 3, only one of the second internal interconnection line 132 is illustrated to include a vertical via 132-1 penetrating the PCB 100 and a horizontal interconnection line 132-2 disposed on the second surface 100b of the PCB 100. Further, each of the first and third internal interconnection lines 131 and 133 is illustrated to include a first vertical via 131-1 or 133-1, a horizontal interconnection line 131-2 or 133-2, and a second vertical via 131-3 or 133-3. More specifically, according to an embodiment, the remaining second internal interconnection line 132, all of the first internal interconnection line 131, and all of the third internal interconnection line 133 may not include any horizontal interconnection line disposed on the second surface 100b of the PCB 100. However, the first, second and third internal interconnection lines 131, 132 and 133 may be realized in many different forms. For example, if each of only N-number of second internal interconnection line 132 is configured to include a vertical via penetrating the PCB 100 and a horizontal interconnection line disposed on the second surface 100b of the PCB 100, only N-number of horizontal interconnection line may be disposed on the second surface 100b of the PCB 100. In the alternative, if each of only M-number of internal interconnection line among the first, second and third internal interconnection lines 131, 132 and 133 is configured to include a vertical via penetrating the PCB 100 and a horizontal interconnection line disposed on the second surface 100b of the PCB 100, only M-number of horizontal interconnection line may be disposed on the second surface 100b of the PCB 100.

As illustrated in FIG. 2, the second surface 100b of the PCB 100 may include the CA external terminal region CR that is separated from the DQ external terminal region DR. Moreover, the CA external connection terminal 121 may be arrayed in a matrix form in the CA external terminal region CR. In addition, the DQ external connection terminal 122 may be arrayed in a matrix form in the DQ external terminal region DR. However, in some embodiments, the CA external connection terminal 121 and the DQ external connection terminal 122 may be arrayed in a different form from the embodiment illustrated in FIG. 2. For example, the CA external connection terminal 121 and the DQ external connection terminal 122 may be arrayed along curved lines or randomly. Although not shown in the drawings, the PCB 100 may further include an additional external connection terminal disposed on the second surface 100b. The additional external connection terminal may have different functions from the CA external connection terminal 121 and the DQ external connection terminal 122. The additional external connection terminal may include a power external connection terminal, a ground external connection terminal, a ZQ external connection terminal, or a clock external connection terminal. The additional external connection terminal may further include at least one floated external connection terminal which is electrically isolated. The additional external connection terminal may be arrayed in the CA external terminal region CR and/or the DQ external terminal region DR. In such an instance, the additional external connection terminal may be arrayed in a matrix form or in another form together with the CA external connection terminal 121 and/or the DQ external connection terminal 122. In the alternative, the additional external connection terminal may be disposed in an outside region of the CA external terminal region CR and the DQ external terminal region DR.

Referring once again to FIG. 3, the CA external connection terminal 121 of the PCB 100 may be disposed to vertically overlap with the first semiconductor chip 200. The CA external connection terminal 121 may be electrically coupled to the first CA chip pad 210 through the CA bonding pad 111. The CA external connection terminal 121 may be electrically coupled to the CA bonding pad 111 through the first internal interconnection line 131. The first internal interconnection line 131 may be disposed to penetrate the PCB 100. Further, each of the first internal interconnection line 131 may include a vertical via in the PCB 100, a first horizontal interconnection line on the first surface 100a, a second horizontal interconnection line on the second surface 100b, and/or a horizontal interconnection line in the PCB 100. According to an embodiment, each of the first internal interconnection line 131 may include the first vertical via 131-1, the horizontal interconnection line 132-2, and the second vertical via 131-3 which are electrically coupled in series. However, the inventive concept is not limited thereto. Each of the first internal interconnection line 131 may include only a single vertical via penetrating the PCB 100 that electrically couples one of the CA external connection terminal 121 to one of the CA bonding pad 111. Alternatively, each of the first internal interconnection line 131 may include a vertical via in the PCB 100, a first horizontal interconnection line on the first surface 100a, a second horizontal interconnection line on the second surface 100b, and/or a horizontal interconnection line in the PCB 100.

The DQ external connection terminal 122 of the PCB 100 may be disposed to vertically overlap with the second semiconductor chip 300. The DQ external connection terminal 122 may be electrically coupled to the first DQ chip pad 220 through the first DQ bonding pad 112. In addition, the DQ external connection terminal 122 may also be electrically coupled to the second DQ chip pad 320 through the second DQ bonding pad 113. The DQ external connection terminal 122 may be electrically coupled to the first DQ bonding pad 112 through the second internal interconnection line 132. Further, the DQ external connection terminal 122 may also be electrically coupled to the second DQ bonding pad 113 through the third internal interconnection line 133. The second and third internal interconnection lines 132 and 133 may be disposed to penetrate the PCB 100. In addition, each of the first and second internal interconnection lines 132 and 133 may include a vertical via in the PCB 100, a first horizontal interconnection line on the first surface 100a, a second horizontal interconnection line on the second surface 100b, and/or a horizontal interconnection line in the PCB 100.

According to an embodiment, each of the second internal interconnection line 132 may include the vertical via 132-1 penetrating the PCB 100 and the horizontal interconnection line 132-2 disposed on the second surface 100b of the PCB 100. Further, each of the third internal interconnection line 133 may include the first vertical via 133-1, the horizontal interconnection line 133-2, and the second vertical via 133-3 which are electrically coupled in series in the PCB 100. However, configurations of the second and third internal interconnection lines 132 and 133 are not limited to the above descriptions. Although not shown in the drawings, the second and third internal interconnection lines 132 or 133 may include only a single vertical via penetrating the PCB 100 that electrically couples one of the DQ external connection terminal 122 to one of the first and second DQ bonding pad 112 and 113. In the alternative, each of the second and third internal interconnection lines 132 and 133 may include a combination of a vertical via in the PCB 100, a first horizontal interconnection line on the first surface 100a, a second horizontal interconnection line on the second surface 100b, and/or horizontal interconnection line in the PCB 100. In some embodiments, the first and second DQ bonding pads 112 and 113 may not be directly electrically coupled to the DQ external connection terminals 122. In contrast, the first DQ bonding pad 112 may be electrically coupled to the second DQ bonding pad 113 through an internal interconnection line in the PCB 100, and the internal interconnection line may be electrically coupled to the DQ external connection terminals 122.

In the semiconductor stack package 10, the first CA chip pad 210 may be electrically coupled to the second CA chip pad 310 through the first bonding wire 411. Further, the CA external connection terminal 121 may be electrically coupled to the first CA chip pad 210 through the CA bonding pad 111. In addition, the DQ external connection terminal 122 may be electrically coupled to the first DQ chip pad 220 through the first DQ bonding pad 112. Moreover, the DQ external connection terminal 122 may also be electrically coupled to the second DQ chip pad 320 through the second DQ bonding pad 113.

The semiconductor stack package 10 may further include an insulation layer 500 disposed on a top surface of the first semiconductor chip 200. The insulation layer 500 may surround a portion of each of the first bonding wire 411. Accordingly, the insulation layer 500 may fix the first bonding wire 411 to suppress a phenomenon (i.e., a wire sweep phenomenon) that the first bonding wire 411 are bent or warped by a flow of a molding material during a subsequent molding process.

The semiconductor stack package 10 may further include a molding layer 600 disposed on the first surface 100a of the PCB 100 to surround the first semiconductor chip 200, the second semiconductor chip 300, and the bonding wires 411, 412, 413 and 414. If the semiconductor stack package 10 includes the insulation layer 500, the molding layer 600 may be formed to cover the insulation layer 500.

The semiconductor stack package 10 may further include an additional semiconductor chip, a dummy chip, a solder resist structure or the like that is disposed between the first or second semiconductor chip 200 or 300 and the PCB 100. If the first and second semiconductor chips 200 and 300 are mounted on the first surface 100a of the PCB 100, the first and second semiconductor chips 200 and 300 may be attached to the first surface 100a of the PCB 100 using an adhesive agent.

In general, if chip pad are disposed in two or more columns on a chip mounted on a PCB and the chip pad are electrically coupled to bonding pad on the PCB using bonding wires, the bonding wires have to be disposed not to intersect each other. This is because electrical shortages occur between the bonding wires if the bonding wires are disposed to intersect each other. In addition, if a multiple number of semiconductor chips having the same function are disposed side-by-side on one surface of the PCB, a number of bonding pads corresponding to chip of a pair of adjacent semiconductor chips have to be disposed on the PCB between the pair of adjacent semiconductor chips. In such an instance, an area to dispose the bonding pads between two adjacent semiconductor chips may increase as compared with a case that only a single semiconductor chip is mounted on a PCB. In contrast, according to an embodiment, no CA bonding pad corresponding to the second CA chip pad 310 are disposed on the PCB 100 between the first and second semiconductor chips 200 and 300. Thus, an area disposing the CA bonding may be saved on the first surface 100a between the first and second semiconductor chips 200 and 300.

The first CA chip pad 210 of the first semiconductor chip 200 may be electrically coupled to the second CA chip pad 310 of the second semiconductor chip 300 through CA bonding wires such as the first bonding wire 411. The CA bonding wires act as electrical paths that do not pass through the PCB 100. The CA bonding pad 111 of the semiconductor stack package 10 may be disposed on a single edge of the PCB 100. In addition, each of the CA bonding pad 111 may be electrically coupled to the CA external terminal region CR using a single path. Thus, a space may be saved for creating multi-paths from the CA bonding pad 111 to the CA external connection terminals 121. As a result, an area of the PCB 100 may be reduced to realize a compact semiconductor stack package.

Figure 4:
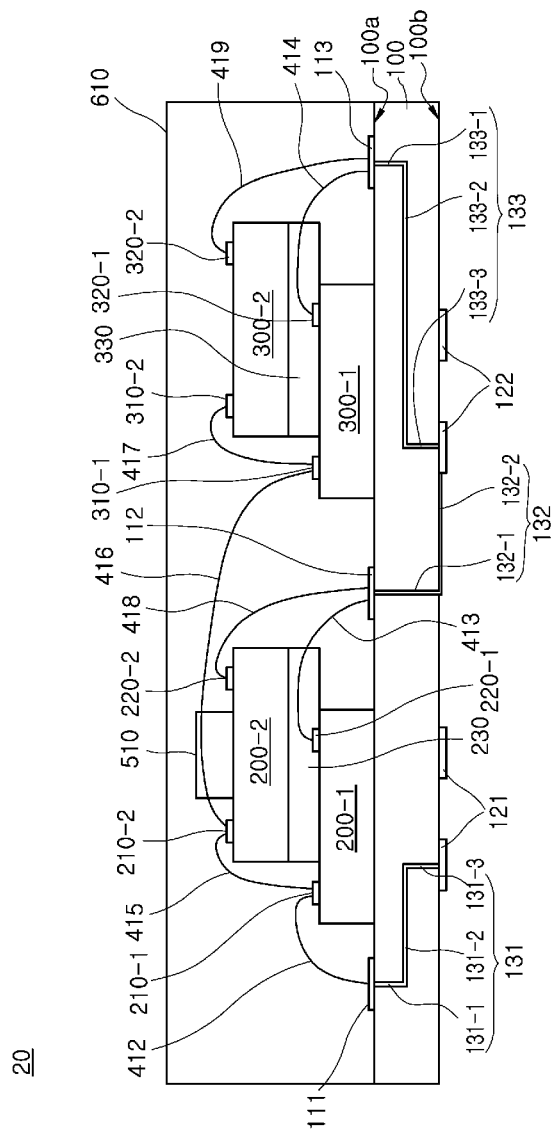
FIG. 4 is a cross-sectional view illustrating a semiconductor stack package according to an embodiment.

Referring to FIG. 4, a cross-sectional view illustrating a semiconductor stack package 20 according to an embodiment is shown. In FIG. 4, the same reference numerals as used in FIG. 3 indicate the same elements. Thus, detailed descriptions of the same elements as described with reference to FIG. 3 will be omitted or briefly mentioned.

In FIG. 4, the semiconductor stack package 20 may include a PCB 100 having a first surface 100a that is opposite to a second surface 100b. The semiconductor stack package 20 may also include first semiconductor chips 200-1 and 200-2 disposed on the first surface 100a of the PCB 100, and second semiconductor chips 300-1 and 300-2 disposed on the first surface 100a of the PCB 100. The first semiconductor chips 200-1 and 200-2 are disposed between the CA bonding pad 111 and the first DQ bonding pad 112. In addition, the second semiconductor chips 300-1 and 300-2 disposed between the first DQ bonding pad 112 and the second DQ bonding pad 113.

Each of the first semiconductor chips 200-1 and 200-2 may include a first CA chip pad 210-1 or 210-2 and a first DQ chip pad 220-1 or 220-2. The first semiconductor chip 200-1 (also, referred to as a first lower semiconductor chip) may be disposed on the first surface of the PCB 100. In addition, the first semiconductor chip 200-2 (also, referred to as a first upper semiconductor chip) may be disposed on a top surface of the first semiconductor chip 200-1 opposite to the PCB 100. More specifically, the first lower semiconductor chip 200-1 and the first upper semiconductor chip 200-2 may be sequentially and vertically stacked on the first surface of the PCB 100. The first upper semiconductor chip 200-2 may be offset toward the first DQ bonding pad 112 relative to a central position of the first lower semiconductor chip 200-1 so that the first CA chip pad 210-1 of the first lower semiconductor chip 200-1 are exposed. Accordingly, the first lower semiconductor chip 200-1 and the first upper semiconductor chip 200-2 may be vertically stacked to constitute a stepped structure. The first upper semiconductor chip 200-2 may be attached to a top surface of the first lower semiconductor chip 200-1 using a first adhesive agent 230. The first lower semiconductor chip 200-1 and the first upper semiconductor chip 200-2 may have the same size. Accordingly, the first DQ chip pad 220-1 of the first lower semiconductor chip 200-1 may be fully covered with the first upper semiconductor chip 200-2.

Each of the second semiconductor chips 300-1 and 300-2 may include a second CA chip pad 310-1 or 310-2 and a second DQ chip pad 320-1 or 320-2. The second semiconductor chip 300-1 (also, referred to as a second lower semiconductor chip) may be disposed on the first surface of the PCB 100. In addition, the second semiconductor chip 300-2 (also, referred to as a second upper semiconductor chip) may be disposed on a top surface of the second semiconductor chip 300-1 opposite to the PCB 100. More specifically, the second lower semiconductor chip 300-1 and the second upper semiconductor chip 300-2 may be sequentially and vertically stacked on the first surface of the PCB 100. The second upper semiconductor chip 300-2 may be offset toward the second DQ bonding pad 113 relative to a central position of the second lower semiconductor chip 300-1 to allow the second CA chip pad 310-1 of the second lower semiconductor chip 300-1 to be exposed. Accordingly, the second lower semiconductor chip 300-1 and the second upper semiconductor chip 300-2 may be vertically stacked to constitute a stepped structure. The second upper semiconductor chip 300-2 may be attached to a top surface of the second lower semiconductor chip 300-1 using a second adhesive agent 330. The second lower semiconductor chip 300-1 and the second upper semiconductor chip 300-2 may have substantially the same size. Accordingly, the second DQ chip pad 320-1 of the second lower semiconductor chip 300-1 may be fully or substantially covered with the second upper semiconductor chip 300-2.

The CA chip pads of the first semiconductor chips 200-1 and 200-2 and the second semiconductor chips 300-1 and 300-2 are electrically coupled to each other. Specifically, the first CA chip pads 210-1 and 210-2 of the first semiconductor chips 200-1 and 200-2 may be electrically coupled to the second CA chip pads 310-1 and 310-2 of the second semiconductor chips 300-1 and 300-2 through CA bonding wires such as fifth bonding wires 415, sixth bonding wires 416 and seventh bonding wires 417 acting as electrical paths that do not pass through the PCB 100. In particular, the first CA chip pad 210-1 of the first lower semiconductor chip 200-1 may be electrically coupled to the first CA chip pad 210-2 of the first upper semiconductor chip 200-2 through the fifth bonding wires 415. The first CA chip pad 210-2 of the first upper semiconductor chip 200-2 may be electrically coupled to the second CA chip pad 310-1 of the second lower semiconductor chip 300-1 through the sixth bonding wires 416. In addition, the second CA chip pad 310-1 of the second lower semiconductor chip 300-1 may be electrically coupled to the second CA chip pad 310-2 of the second upper semiconductor chip 300-2 through the seventh bonding wires 417. The CA chip pad may be electrically coupled to the corresponding CA bonding pad 111 of the PCB 100. The first CA chip pad 210-1 of the first lower semiconductor chip 200-1 may be electrically coupled to the CA bonding pad 111 of the PCB 100 through second bonding wires 412.

In the semiconductor stack package 20, the first CA chip pad 210-2 of the first upper semiconductor chip 200-2 may be electrically coupled to the second CA chip pad 310-1 of the second lower semiconductor chip 300-1 through the sixth bonding wires 416. Although not shown, bonding wires for electrically coupling the first CA chip pads 210-1 and 210-2 of the first semiconductor chips 200-1 and 200-2 to the second CA chip pads 310-1 and 310-2 of the second semiconductor chips 300-1 and 300-2 may be realized in various forms according to the embodiments. In various embodiments, the first CA chip pad 210-2 of the first upper semiconductor chip 200-2 may be electrically coupled to the second CA chip pad 310-2 of the second upper semiconductor chip 300-2 through a group of bonding wires.

The semiconductor stack package 20 may further include an insulation layer 510 disposed on a top surface of the first upper semiconductor chip 200-2 opposite to the first lower semiconductor chip 200-1. The insulation layer 510 may surround a portion of each of the sixth bonding wires 416 that electrically couple the first semiconductor chips 200-1 and 200-2 to the second semiconductor chips 300-1 and 300-2. Accordingly, the insulation layer 510 may fix the sixth bonding wires 416 to suppress a phenomenon (i.e., a wire sweep phenomenon) that the sixth bonding wires 416 are bent or warped by a flow of a molding material during a subsequent molding process.

The semiconductor stack package 20 may further include a molding layer 610 disposed on the first surface 100a of the PCB 100 to surround the first semiconductor chips 200-1 and 200-2, the second semiconductor chips 300-1 and 300-2, and the bonding wires 412, 413, 414, 415, 416 and 417. If the semiconductor stack package 20 includes the insulation layer 510, the molding layer 610 may be formed to cover the insulation layer 510.

The first DQ chip pad 220-1 of the first lower semiconductor chip 200-1 may be electrically coupled to the first DQ bonding pad 112 through third bonding wires 413. Further, the first DQ chip pad 220-2 of the first upper semiconductor chip 200-2 may be electrically coupled to the first DQ bonding pad 112 through eighth bonding wires 418. The first DQ chip pad 220-1 of the first lower semiconductor chip 200-1 may be covered with the first adhesive agent 230. The first adhesive agent 230 may surround a portion of each of the third bonding wires 413 and may fix the third bonding wires 413.

The second DQ chip pad 320-1 of the second lower semiconductor chip 300-1 may be electrically coupled to the second DQ bonding pad 113 through fourth bonding wires 414. In addition, the second DQ chip pad 320-2 of the second upper semiconductor chip 300-2 may be electrically coupled to the second DQ bonding pad 113 through ninth bonding wires 419. The second DQ chip pad 320-1 of the second lower semiconductor chip 300-1 may be covered with the second adhesive agent 330. The second adhesive agent 330 may surround a portion of each of the fourth bonding wires 414 and may fix the fourth bonding wires 414.

The semiconductor stack package 20 may further include a first additional semiconductor chip, a first dummy chip, a first solder resist structure or the like disposed between the first lower semiconductor chip 200-1 and the PCB 100. The semiconductor stack package 20 may also include a second additional semiconductor chip, a second dummy chip, a second solder resist structure or the like disposed between the second lower semiconductor chip 300-1 and the PCB 100. If the first and second lower semiconductor chips 200-1 and 300-1 are mounted on the first surface 100a of the PCB 100, the first and second lower semiconductor chips 200-1 and 300-1 may be attached to the first surface 100a of the PCB 100 using an adhesive agent.

In the semiconductor stack package 20, the first upper semiconductor chip 200-2 may be offset toward the second upper semiconductor chip 300-2 relative to a central position of the first lower semiconductor chip 200-1 to allow the first CA chip pad 210-1 of the first lower semiconductor chip 200-1 to be exposed. As a result, the first lower semiconductor chip 200-1 and the first upper semiconductor chip 200-2 may be vertically stacked to constitute a stepped structure. Similarly, the second upper semiconductor chip 300-2 may be offset relative to a central position of the second lower semiconductor chip 300-1 so that the second CA chip pad 310-1 of the second lower semiconductor chip 300-1 are exposed. Accordingly, the second lower semiconductor chip 300-1 and the second upper semiconductor chip 300-2 may also be vertically stacked to constitute a stepped structure. The first CA chip pads 210-1 and 210-2 and the second CA chip pads 310-1 and 310-2 may be electrically coupled to each other through CA bonding wires such as the fifth, sixth and seventh bonding wires 415, 416 and 417. In addition, the first CA chip pad 210-1 may be electrically coupled to the CA bonding pad 111 of the PCB 100 through the second bonding wires 412. The CA bonding pad 111 may be electrically coupled to CA external connection terminals 121, which are disposed on the second surface 100b of the PCB 100, through first internal interconnection lines 131 penetrating the PCB 100.

According to an embodiment, the semiconductor stack package 20 may include the first and second lower semiconductor chips 200-1 and 300-1 disposed side-by-side on the PCB 100 and the first and second upper semiconductor chips 200-2 and 300-2 respectively stacked on the first lower semiconductor chip 200-1 and the second lower semiconductor chip 300-1. In addition, the first upper semiconductor chip 200-2 may be offset relative to a central position of the first lower semiconductor chip 200-1 so that the first lower and upper semiconductor chips 200-1 and 200-2 constitute a stepped structure. Further, the second upper semiconductor chip 300-2 may also be offset relative to a central position of the second lower semiconductor chip 300-1 so that the second lower and upper semiconductor chips 300-1 and 300-2 constitute a stepped structure. However, in various embodiments, the first and second semiconductor chips 200-1, 200-2, 300-1 and 300-2 may be stacked in many different forms. For example, the first semiconductor chips may include three or more semiconductor chips which are vertically stacked. In addition, the second semiconductor chips may also include three or more semiconductor chips which are vertically stacked. Even in such a case, the CA chip pads of the first and second semiconductor chips may be electrically coupled to each other through bonding wires. In various other embodiments, the semiconductor stack package 20 may further include at least one third semiconductor chip. The at least one third semiconductor chip may be disposed on the first surface 100a of the PCB 100 to be adjacent to the second DQ chip pads 320-1 and 320-2 of the second semiconductor chips 300-1 and 300-2. In such a case, CA chip pad of the at least one third semiconductor chip may also be electrically coupled to the first and second CA chip pads 210-1, 210-2, 310-1 and 310-2 through bonding wires.

Figure 5:
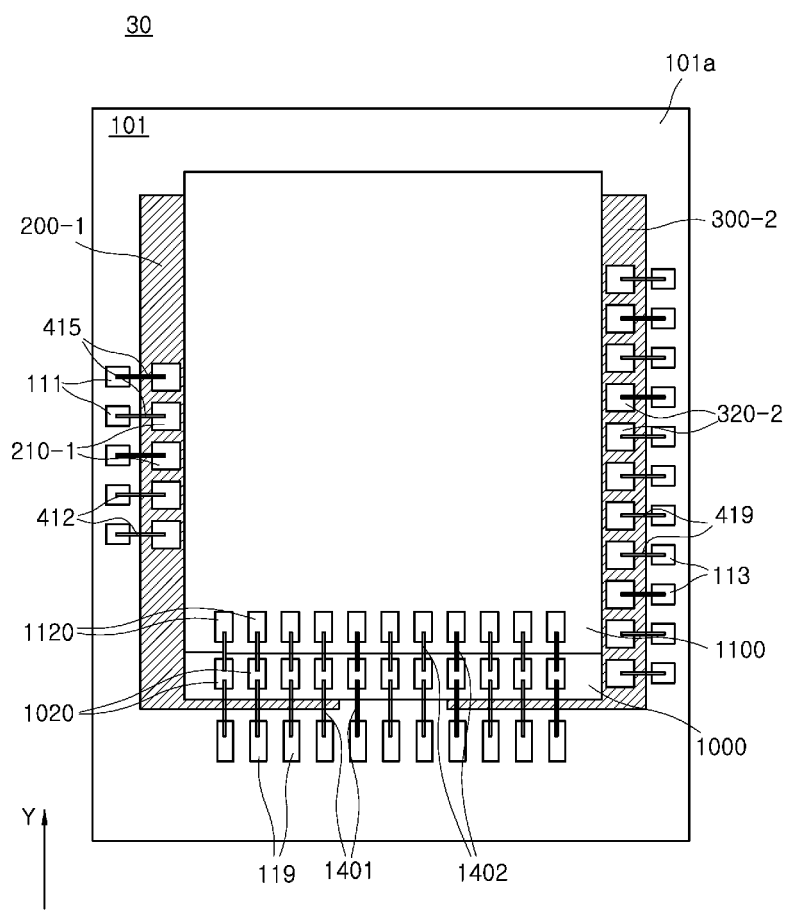
FIG. 5 is a top plan view illustrating a semiconductor stack package according to an embodiment.
Figure 6:
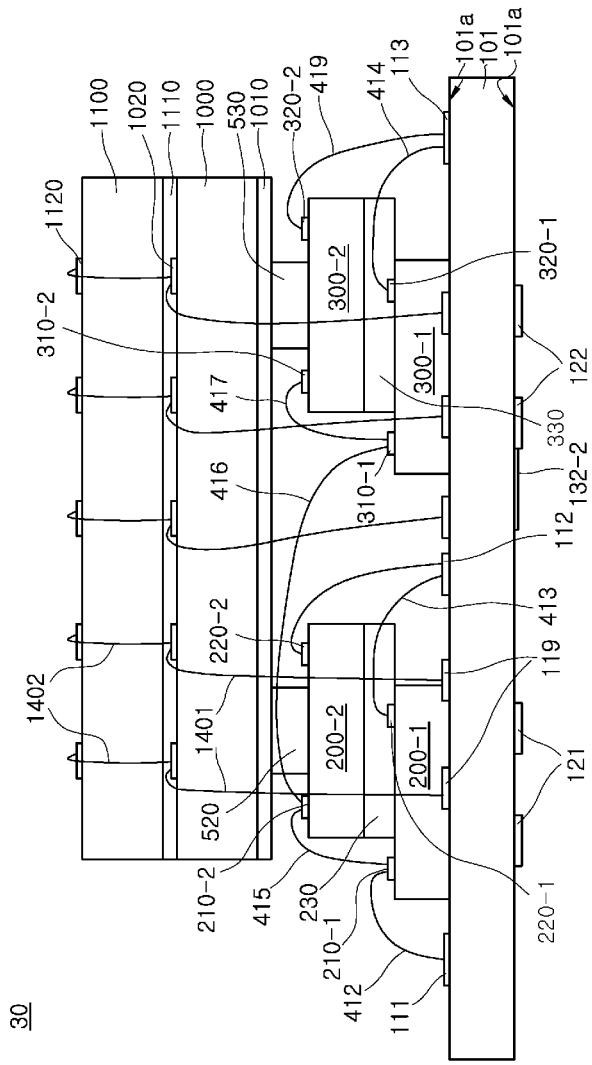
FIG. 6 is a front view of the semiconductor stack package shown in a Y-direction of FIG. 5.

Referring to FIGS. 5 and 6, a semiconductor stack package 30 according to an embodiment is shown. FIG. 5 is a top plan view illustrating the semiconductor stack package 30, and FIG. 6 is a front view of the semiconductor stack package 30 shown in a Y-direction of FIG. 5.

The semiconductor stack package 30 illustrated in FIGS. 5 and 6 may further include a third lower semiconductor chip 1000 and a third upper semiconductor chip 1100 as compared with the semiconductor stack package 20 illustrated in FIG. 4. A PCB 101 of the semiconductor stack package 30 may further include first bonding pad 119 as compared with the PCB 100 described with reference to FIGS. 1, 2, 3 and 4. In FIGS. 5 and 6, the same reference numerals as used in FIG. 4 indicate the same elements. Thus, detailed descriptions of the same elements will be omitted or briefly mentioned.

In FIG. 5, if the CA bonding pad 111 is disposed on a first edge of the PCB 101 and the second DQ bonding pad 113 is disposed on a second edge of the PCB 101 opposite to the first edge, the first bonding pad 119 may be disposed on a third edge of the PCB 101. The first bonding pad 119 may be electrically coupled to a first chip pad 1020 on the third lower semiconductor chip 1000 through tenth bonding wires 1401. In addition, the first chip pad 1020 may be electrically coupled to a second chip pad 1120 on the third upper semiconductor chip 1100 through eleventh bonding wires 1402.

The first chip pad 1020 may be disposed on a surface of the third lower semiconductor chip 1000 opposite to the PCB 101. The first chip pad 1020 may include CA chip pad, DQ chip pad, a power chip pad, a ground chip pad, a ZQ chip pad, or a clock chip pad. The first chip pad 1020 may be arrayed in a line along an edge of the third lower semiconductor chip 1000 which is closest to the first bonding pad 119.

The third upper semiconductor chip 1100 may have the same size as the third lower semiconductor chip 1000. In addition, the second chip pad 1120 may be disposed to have substantially the same configuration as the first chip pad 1020. The third upper semiconductor chip 1100 may be stacked on the third lower semiconductor chip 1000 so that the first chip pad 1020 of the third lower semiconductor chip 1000 are exposed. As a result, the third lower semiconductor chip 1000 and the third upper semiconductor chip 1100 may provide a stepped structure.

In FIG. 6, the semiconductor stack package 30 may include the PCB 101 having a first surface 101a opposite to a second surface 101b, the first semiconductor chips 200-1 and 200-2 stacked on the first surface 101a of the PCB 101, and the second semiconductor chips 300-1 and 300-2 stacked on the first surface 101a of the PCB 101. The third lower and upper semiconductor chips 1000 and 1100 may be sequentially and vertically stacked on the first and second semiconductor chips 200-1, 200-2, 300-1 and 300-2.

The third lower semiconductor chip 1000 may be attached on the first and second upper semiconductor chips 200-2 and 300-2 using a fifth adhesive agent 1010. A first insulation layer 520 may be disposed between the fifth adhesive agent 1010 and the first upper semiconductor chip 200-1. In addition, a second insulation layer 530 may be disposed between the fifth adhesive agent 1010 and the second upper semiconductor chip 300-1. The first and second insulation layers 520 and 530 may support the third lower semiconductor chip 1000. The first insulation layer 520 may be disposed to surround and fix sixth bonding wires 416. The third upper semiconductor chip 1100 may be attached to a top surface of the third lower semiconductor chip 1000 using a sixth adhesive agent 1110. Although not shown, at least one additional third semiconductor chip may be stacked on the third upper semiconductor chip 1100.

The CA chip pad among the first and second chip pads 1020 and 1120 may be electrically coupled to CA external connection terminal 121 disposed on the second surface 101b of the PCB 101. In addition, the DQ chip pads among the first and second chip pads 1020 and 1120 may be electrically coupled to DQ external connection terminals 122 disposed on the second surface 101b of the PCB 101.

The semiconductor stack package 30 may further include a molding layer disposed on the first surface 101a of the PCB 101 to surround the first semiconductor chips 200-1 and 200-2, the second semiconductor chips 300-1 and 300-2, and the third semiconductor chips 1000 and 1100. The molding layer may also be disposed to cover the bonding pads 111, 112, 113 and 119 of the PCB 101 and the chip pads of the semiconductor chips.

Referring again to FIGS. 5 and 6, in each of the first and second semiconductor chips 200-1, 200-2, 300-1 and 300-2, the CA chip pad may be disposed to be opposite to the DQ chip pad on a surface of each semiconductor chip. The CA chip pad of any one among the first and second semiconductor chips 200-1, 200-2, 300-1 and 300-2 may be electrically coupled to the CA chip pad of another chip among the first and second semiconductor chips 200-1, 200-2, 300-1 and 300-2 through the bonding wires acting as electrical paths that do not pass through the PCB 101. The CA chip pad may be electrically coupled to the CA external connection terminals 121 through the CA bonding pad 111. The DQ chip pad of each of the semiconductor chips may be electrically coupled to the DQ bonding pad disposed to be adjacent thereto. Further, the DQ bonding pad may be electrically coupled to the DQ external connection terminal 122 through the second and third internal interconnection lines (132 and 133 of FIG. 4).

The first bonding pad 119 disposed on the PCB 101 and electrically coupled to the third semiconductor chips 1000 and 1100 may include the CA bonding pad and the DQ bonding pad and may be disposed on a predetermined edge of the PCB 101. The CA bonding pad 111 and the DQ bonding pads 112 and 113 electrically coupled to the first and second semiconductor chips 200-1, 200-2, 300-1 and 300-2 may not be disposed on the predetermined edge of the PCB 101. The first chip pad 1020 of the third lower semiconductor chip 1000 may include the CA chip pad and the DQ chip pad and may be disposed on an edge of the third lower semiconductor chip 1000. Similarly, the second chip pad 1120 of the third upper semiconductor chip 1100 may include the CA chip pad and the DQ chip pad. The second chip pad 1120 may also be disposed on an edge of the third upper semiconductor chip 1100. The first chip pad 1020 and the second chip pad 1120 may be electrically coupled to the bonding pad 119 through the bonding wires. The bonding pad 119 may be electrically coupled to the CA external connection terminal 121 and the DQ external connection terminal 122 through internal interconnection lines disposed in the PCB 101. If the bonding pad 119 further include a power bonding pad, a ground bonding pad, a ZQ bonding pad and a clock bonding pad, the power bonding pad, the ground bonding pad, the ZQ bonding pad and the clock bonding pad may be electrically coupled to the corresponding an additional external connection terminal disposed on the second surface 101b of the PCB 101.

The additional external connection terminal having different functions from the CA external connection terminal 121 and the DQ external connection terminal 122 may be arrayed in a CA external terminal region CR and/or a DQ external terminal region DR. In such an instance, the additional external connection terminals may be arrayed in a matrix form or in another form together with the CA external connection terminal 121 and/or the DQ external connection terminal 122. In the alternative, the additional external connection terminal may be disposed in an outside region of the CA external terminal region CR and the DQ external terminal region DR. In various embodiments, the additional external connection terminal may further include at least one floated external connection terminal which is electrically isolated.

Figure 7:
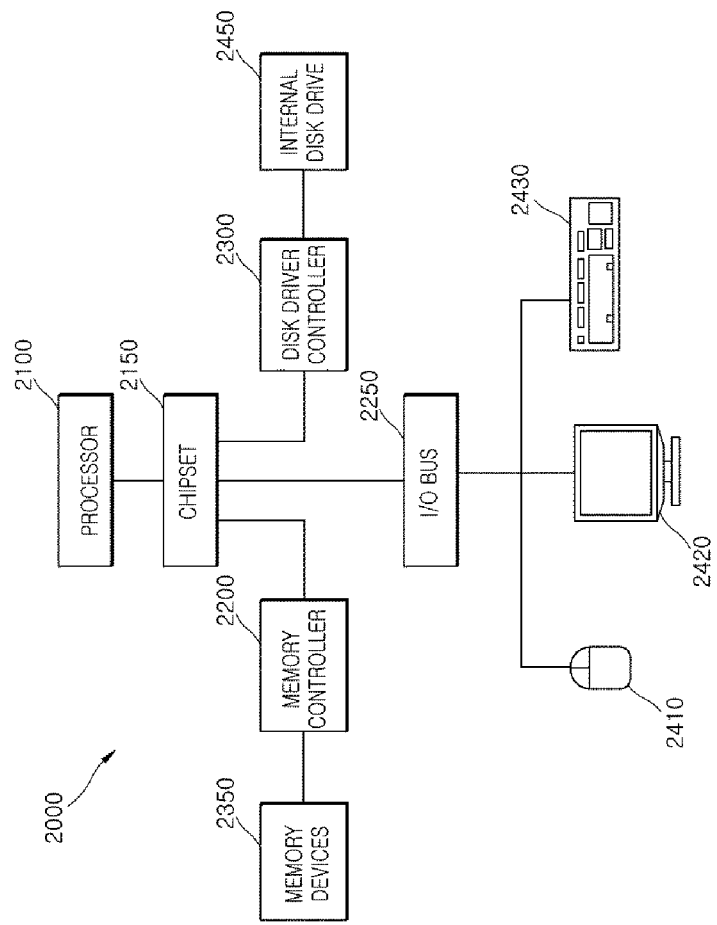
FIG. 7 illustrates a block diagram of a system employing a memory controller circuit in accordance with an embodiment of the invention.

Referring to FIG. 7, a system 2000 may include one or more processors 2100. The processor 2100 may be used individually or in combination with other processors. A chipset 2150 may be electrically coupled to the processor 2100. The chipset 2150 is a communication pathway for signals between the processor 2100 and other components of the system 2000. Other components may include a memory controller 2200, an input/output ("I/O") bus 2250, and a disk drive controller 2300. Depending on the configuration of the system 2000, any one of a number of different signals may be transmitted through the chipset 2150.

The memory controller 2200 may be electrically coupled to the chipset 2150. The memory controller 2200 can receive a request provided from the processor 2100 through the chipset 2150. The memory controller 2200 may be electrically coupled to one or more memory devices 2350. The memory devices 2350 may include the semiconductor stack package described above.

The chipset 2150 may also be electrically coupled to the I/O bus 2250. The I/O bus 2250 may serve as a communication pathway for signals from the chipset 2150 to I/O devices 2410, 2420 and 2430. The I/O devices 2410, 2420 and 2430 may include a mouse 2410, a video display 2420, or a keyboard 2430. The I/O bus 2250 may employ any one of a number of communications protocols to communicate with the I/O devices 2410, 2420, and 2430.

The disk drive controller 2300 may also be electrically coupled to the chipset 2150. The disk drive controller 2300 may serve as the communication pathway between the chipset 2150 and one or more internal disk drives 2450. The disk drive controller 2300 and the internal disk drives 2450 may communicate with each other or with the chipset 2150 using virtually any type of communication protocol.

The embodiments of the disclosure have been disclosed above for illustrative purposes. Those of ordinary skill in the art will appreciate that various modifications, additions, and substitutions are possible, without departing from the scope and spirit of the disclosure as disclosed in the accompanying claims.

What is claimed is:
1. A semiconductor stack package comprising:
  a printed circuit board (PCB) having a first surface opposite to a second surface;
  a command/address (CA) bonding pad, a first data input/output (DQ) bonding pad, and a second DQ bonding pad disposed on the first surface;

a first semiconductor chip disposed on the first surface between the CA bonding pad and the first DQ bonding pad, including a first CA chip pad and a first DQ chip pad;

a second semiconductor chip disposed on the first surface between the first DQ bonding pad and the second DQ bonding pad, including a second CA chip pad and a second DQ chip pad; and a CA external connection terminal and a DQ external connection terminal disposed on the second surface, wherein the first CA chip pad is electrically coupled to the second CA chip pad through a first bonding wire, wherein the CA external connection terminal is electrically coupled to the first CA chip pad through the CA bonding pad, and wherein the DQ external connection terminal is electrically coupled to the first DQ chip pad through the first DQ bonding pad and is electrically coupled to the second DQ chip pad through the second DQ bonding pad.

2. The semiconductor stack package of claim 1, wherein the first CA chip pad is disposed on an edge of the first semiconductor chip to be adjacent to the CA bonding pad; and wherein the first DQ chip pad is disposed on an edge of the first semiconductor chip to be adjacent to the first DQ bonding pad.

3. The semiconductor stack package of claim 1, wherein the second CA chip pad is disposed on an edge of the second semiconductor chip to be adjacent to the first DQ bonding pad; and wherein the second DQ chip pad is disposed on an edge of the second semiconductor chip to be adjacent to the second DQ bonding pad.

4. The semiconductor stack package of claim 1, wherein the CA external connection terminal is configured to vertically overlap with the first semiconductor chip; and wherein the DQ external connection terminal is configured to vertically overlap with the second semiconductor chip.

5. The semiconductor stack package of claim 1, further comprising:

an insulation layer disposed on the first semiconductor chip to fix the first bonding wire.

6. The semiconductor stack package of claim 5, further comprising:

a molding layer disposed on the first surface of the PCB to surround the first semiconductor chip, the second semiconductor chip, the first bonding wire and the insulation layer.

7. The semiconductor stack package of claim 1, further comprising:

a second bonding wire electrically coupling the CA bonding pad to the first CA chip pad;

a third bonding wire electrically coupling the first DQ chip pad to the first DQ bonding pad; and a fourth bonding wire electrically coupling the second DQ chip pad to the second DQ bonding pad.

8. A semiconductor stack package comprising:

a printed circuit board (PCB);

a first semiconductor chip and a second semiconductor chip disposed side-by-side on a first surface of the PCB to be spaced apart from each other, each including a command/address (CA) chip pad and a data input/output (DQ) chip pad; and a CA bonding pad, a first DO bonding pad and a second DO bonding pad configured on the first surface of the PCB, wherein the first semiconductor chip is disposed between the CA bonding pad and the first DO bonding pad on the first surface, and the second semiconductor chip is disposed directly between the first DO bonding pad and the second DO bonding pad on the first surface, and wherein the CA bonding pad is electrically coupled to the CA chip pads of the first and the second semiconductor chip through a bonding wire, and wherein the first DO bonding pad is electrically coupled to the DO chip pad of the first semiconductor chip and the second DO bonding pad is electrically coupled to the DO chip pad of the second semiconductor chip.

9. The semiconductor stack package of claim 8, further comprising:

an external CA terminal and an external DQ terminal disposed on a second surface of the PCB opposite to the first and second semiconductor chips.

10. The semiconductor stack package of claim 9, wherein the external CA terminal is electrically coupled to the CA chip pad through the CA bonding pad; and wherein the external DQ terminal is electrically coupled to the DQ chip pad through the DQ bonding pad.

11. The semiconductor stack package of claim 8, wherein the first semiconductor chip includes first stacked semiconductor chips;

wherein each of the first stacked semiconductor chips includes a first CA chip pad and the first stacked semiconductor chips are disposed to provide a stepped structure so that the first CA chip pads are exposed;

wherein the second semiconductor chip includes second stacked semiconductor chips;

wherein each of the second stacked semiconductor chips includes a second CA chip pad and the second stacked semiconductor chips are disposed to provide a stepped structure so that the second CA chip pads are exposed; and wherein the first and second CA chip pads are electrically coupled to each other through bonding wires.

12. The semiconductor stack package of claim 11, wherein the first CA chip pad of an uppermost semiconductor chip of the first stacked semiconductor chips is electrically coupled to the second CA chip pad of an lowermost semiconductor chip of the second stacked semiconductor chips through one of the bonding wires.

13. The semiconductor stack package of claim 8, further comprising:

a first insulation layer disposed on the first semiconductor chip;

a second insulation layer disposed on the second semiconductor chip; and a third semiconductor chip stacked on the first and second insulation layers, wherein the third semiconductor chip is supported by the first and second insulation layers.

14. The semiconductor stack package of claim 13, wherein the third semiconductor chip includes third stacked semiconductor chips;

wherein each of the third stacked semiconductor chips includes a third CA chip pad and the third stacked semiconductor chips are disposed to provide a stepped structure so that the third CA chip pads are exposed.

* * * * *